US011051626B2

(12) United States Patent
Oh et al.

(10) Patent No.: US 11,051,626 B2
(45) Date of Patent: Jul. 6, 2021

(54) FOOTHOLD INCLUDING THERMOELECTRIC MODULE

(71) Applicant: LG ELECTRONICS INC., Seoul (KR)

(72) Inventors: Minkyu Oh, Seoul (KR); Hwayoung Song, Seoul (KR); Jimin Yuk, Seoul (KR); Yanghwan No, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 49 days.

(21) Appl. No.: 16/670,514

(22) Filed: Oct. 31, 2019

(65) Prior Publication Data

US 2020/0154894 A1 May 21, 2020

(30) Foreign Application Priority Data

Nov. 20, 2018 (KR) .......................... 10-2018-0143419

(51) Int. Cl.
| | |
|---|---|
| *A47C 16/02* | (2006.01) |
| *A47C 7/74* | (2006.01) |
| *A47B 83/02* | (2006.01) |
| *F25B 21/04* | (2006.01) |
| *H01L 35/30* | (2006.01) |

(52) U.S. Cl.
CPC .............. *A47C 7/744* (2013.01); *A47B 83/02* (2013.01); *A47C 16/02* (2013.01); *F25B 21/04* (2013.01); *H01L 35/30* (2013.01)

(58) Field of Classification Search
USPC ....................................... 297/180.12–180.14
See application file for complete search history.

(56) References Cited

U.S. PATENT DOCUMENTS

| | | | | |
|---|---|---|---|---|
| 3,032,634 | A | * | 5/1962 | Steinel ...................... A61F 7/02 |
| | | | | 219/521 |
| D363,189 | S | * | 10/1995 | Griphoff ........................ D6/691 |
| 5,491,908 | A | * | 2/1996 | Ruiz ...................... A47K 10/48 |
| | | | | 34/202 |
| 5,623,828 | A | | 4/1997 | Harrington |
| 2002/0083716 | A1 | | 7/2002 | Ko |
| 2006/0027551 | A1 | | 2/2006 | Dehli |
| 2006/0108852 | A1 | * | 5/2006 | Boucher ................ A47C 16/02 |
| | | | | 297/423.41 |
| 2009/0022485 | A1 | * | 1/2009 | Madden ................ A47K 10/48 |
| | | | | 392/380 |
| 2013/0026245 | A1 | | 1/2013 | Gallo |
| 2020/0154895 | A1 | * | 5/2020 | Oh ........................ A47C 7/748 |

FOREIGN PATENT DOCUMENTS

| | | | |
|---|---|---|---|
| EP | 3657084 A1 | | 5/2020 |
| JP | H-0951833 | * | 2/1997 |
| KR | 10-2011-0101363 | * | 9/2011 |
| KR | 10-2013-0066328 A | | 6/2013 |
| KR | 20140063176 A | * | 5/2014 |

* cited by examiner

*Primary Examiner* — Robert Canfield
(74) *Attorney, Agent, or Firm* — Dentons US LLP

(57) ABSTRACT

A foothold including a thermoelectric module includes a module housing in which a dissipation fan and a thermoelectric element are provided, and a blowing portion disposed at a first side of the module housing and having a blowing fan. Further, the thermoelectric module further includes a dissipation heat sink installed over the dissipation fan, and a cover provided at the upper portion of the module housing and having a top surface on which the user's feet may be placed.

20 Claims, 14 Drawing Sheets

FOOTHOLD INCLUDING THERMOELECTRIC MODULE

CROSS-REFERENCE TO RELATED APPLICATIONS

This application claims priority under 35 U.S.C. 119 and 35 U.S.C. 365 to Korean Patent Application No. 10-2018-0143419 filed on Nov. 20, 2018 in Korea, the entire contents of which is hereby incorporated by reference in its entirety.

FIELD OF THE DISCLOSURE

The present disclosure is related to a foothold including a thermoelectric module.

BACKGROUND

When sitting and studying at a desk, sometimes a person feels hot or cold at their lower body. This is because the sides and the front of the desk are closed to the outside, so ventilation is poor. In particular, during the summer season with the hot weather, even if an air conditioner is operated, cold air does not reach well into the space under the desk, so the person feels hot at their lower body, and sweats if severe. In this situation, if the person is studying, there is a problem that the person's concentration decreases, and their learning performance deteriorates.

In order to solve this problem, there is inconvenience in that the person has to put and operate a discrete cooling device such as a mobile air conditioner or an electric fan at the side of the desk.

SUMMARY

In order to solve the problems described above, an aspect of the present disclosure is to provide a foothold including a thermoelectric module, the foothold being able to make a user feel comfortable by supplying conditioned air to their lower body, particularly, the feet.

Another aspect is to provide a foothold including a thermoelectric module, the foothold being able to generate cold/hot air, using a thermoelectric module, and to additionally supply air to the user's feet.

Another aspect is to provide a foothold including a thermoelectric module, the foothold being able to supply cold/hot air to the user's both feet by configuring at least two air supply channels.

Another aspect is to provide a foothold including a thermoelectric module in which air that has passed through a dissipation heat sink can smoothly flow by configuring a dissipation channel between two air supply channels.

Another aspect is to provide a foothold including a thermoelectric module in which a blowing portion is provided at both sides of a module housing, in which a thermoelectric module is installed, and air is supplied from the blowing portions, thereby being able to supply coldness and/or hotness to the user's feet through conduction and convection.

Another aspect is to provide a foothold including a thermoelectric module in which a fan for supplying air and a dissipation fan are separately provided, so an air supply channel and a dissipation channel can be easily formed.

Another aspect is to provide a foothold including a thermoelectric module in which fins are provided on the top surface of a cover, thereby being able to increase a cold/heat transfer rate from the cover.

Another aspect is to provide a foothold including a thermoelectric module in which a cover of a module housing is provided to be detachable, so the cover can be washed.

Another aspect is to provide a foothold including a thermoelectric module in which an air guide is provided between a module housing and a blowing portion, whereby air supplied from the blowing portion can be easily supplied to the module housing.

Another aspect is to provide a foothold including a thermoelectric module in which a blowing fan is provided at a side of a module housing and the blowing fan is disposed higher than the module housing by a fan supporting portion, whereby air can be easily supplied to the space over the module housing from the blowing fan.

A foothold including a thermoelectric module according to an embodiment of the present disclosure includes a module housing in which a dissipation fan and a thermoelectric element are provided, and a blowing portion disposed at a first side of the module housing and having a blowing fan.

The thermoelectric module includes a dissipation heat sink installed over the dissipation fan.

The thermoelectric module further includes a cover provided at the upper portion of the module housing and having a top surface on user's feet are place, and the cover functions as a heat absorption/dissipation heat sink.

The thermoelectric module further includes a thermoelectric element disposed between the dissipation heat sink and the cover.

The dissipation fan or the blowing fan is configured as an axial fan.

The module housing my include: a housing body having a housing opening formed through the housing body in an up-down direction; and a cover disposed on the housing body.

The dissipation fan is disposed at a lower portion in the housing opening, and the dissipation heat sink is disposed over the dissipation fan.

The foothold further includes: a cover opening formed on at least one surface of the housing main body and discharging air that has passed through the dissipation heat sink; and a dissipation cover disposed in the cover opening.

A dissipation channel is formed in the module housing. The dissipation channel includes: a sink suction side channel forming an air channel from the dissipation fan to the dissipation heat sink; and a sink discharge side channel extending from the dissipation heat sink to the dissipation cover.

The cover includes: a cover plate disposed on the housing body; and a plate protrusion protruding downward from a bottom surface of the cover plate, the plate protrusion being in contact with a heat absorption/dissipation portion of the thermoelectric element.

The foothold includes a module insulator surrounding the thermoelectric element and having an insulator opening, in which the plate protrusion is inserted into the insulator opening.

The blowing portion further includes a channel guide forming an installation space in which the blowing fan is installed, and having a guide discharge portion at an upper end thereof.

The channel guide includes an inclined portion configured to be rounded or inclined toward the module housing.

The blowing portion includes: a first blowing portion disposed at a first side of the module housing; and a second blowing portion disposed at a second side of the module housing.

The blowing portion further includes: a blowing discharge portion formed on a top surface of the blowing portion to discharge air; and an air guide guiding air, which has passed through the blowing fan, over the cover.

The air guide is disposed between the blowing discharge portion and the cover.

The air guide includes: a first surface extending from the top surface of the blowing portion to be inclined upward at a first angle; and a second surface extending from an upper end of the first surface to be inclined downward at a second angle toward the cover.

The second angle is greater than the first angle.

The blowing portion further includes a fan support portion configured to support the blowing fan, and a height of a center portion of the blowing fan is greater than a height of the cover.

The cover includes: a cover plate disposed on the housing body; and at least one fine protruding upward from a top surface of the cover plate.

According to the foothold according to the present disclosure, there is an effect that it is possible to make a user feel comfortable by supplying conditioned air to the lower portion of the user's body, particularly, to the feet.

Further, it is possible to generate cold/hot air, using a thermoelectric module, and additionally to supply the air to user's feet.

Further, by configuring at least two air supply channels, it is possible to effectively supply air to user's both feet.

Further, by configuring a dissipation channel between the two air supply channels, air that has passed through the dissipation heat sink can smoothly flow.

Further, a blowing portion is provided at both sides of a module housing, in which a thermoelectric module is installed, and air is supplied from the blowing portions, thereby being able to supply coldness and/or hotness to user's feet through conduction and convection.

Further, fins are provided on the top surface of a cover, whereby a heat/cold transfer rate from the cover can be increased.

Further, a cover of the module housing is provided to be detachable, so the cover can be washed.

Further, an air guide is provided between a module housing and a blowing portion, whereby air supplied from the blowing portion can be easily supplied to the module housing.

Further, a blowing fan is provided at a side of a module housing and the blowing fan is disposed higher than the module housing by a fan supporting portion, whereby air can be easily supplied to the space over the module housing from the blowing fan.

DETAILED DESCRIPTION

Figure 1:
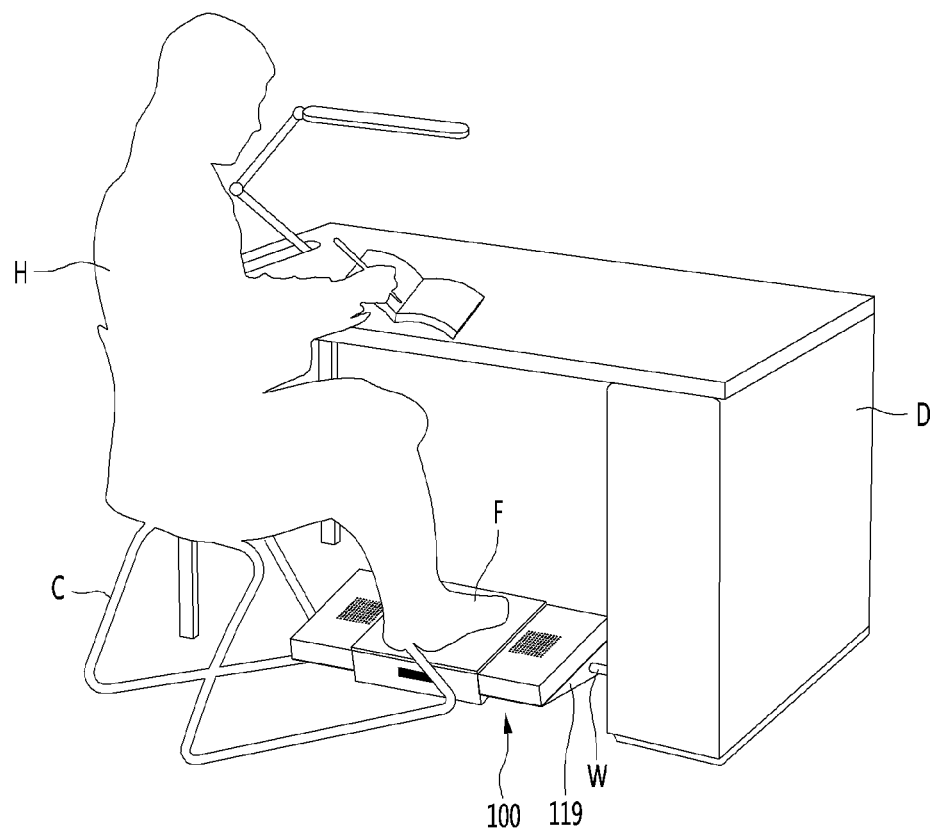
FIG. 1 is a view showing a user using a foothold according to an embodiment of the present disclosure.

Hereinafter, embodiments of the present disclosure are described in detail with reference to exemplary drawings. It should be noted that when components are given reference numerals in the drawings, the same or similar components may be given the same reference numerals even if they are shown in different drawings. Further, in the following description of embodiments of the present disclosure, when detailed description of well-known configurations or functions is determined as obscuring the understanding of the embodiments of the present disclosure, they may be omitted or not described in detail.

Further, terms 'first', 'second', 'A', 'B', '(a)', and '(b)' may be used in the following description of the components of embodiments of the present disclosure. The terms are provided only for discriminating components from other components and, the essence, sequence, or order of the components are not limited by the terms. When a component is described as being "connected", "combined", or "coupled" with another component, it should be understood that the component may be connected or coupled to another component directly or with another component interposing therebetween.

Figure 2:
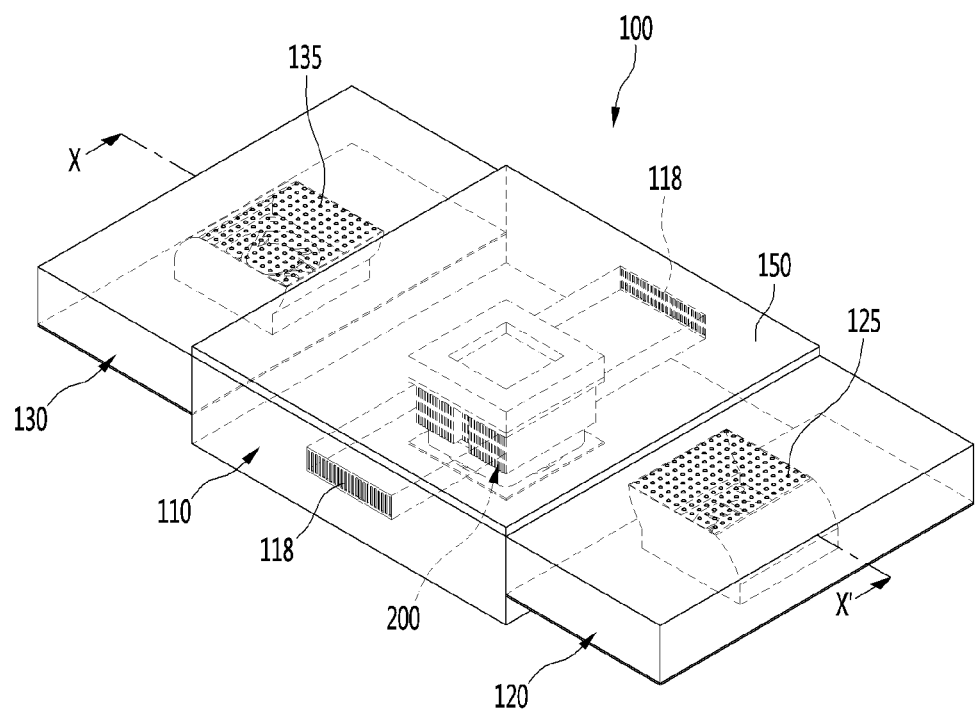
FIG. 2 is a transparent view showing an interior of a foothold according to a first embodiment of the present disclosure.
Figure 3:
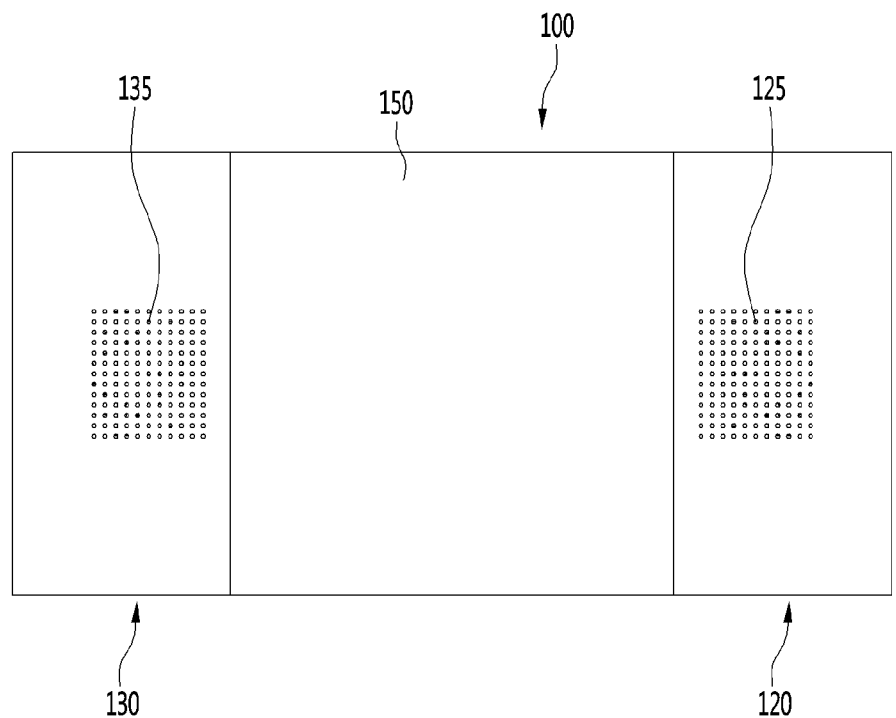
FIG. 3 is a plan view of the foothold according to the first embodiment of the present disclosure.
Figure 4:
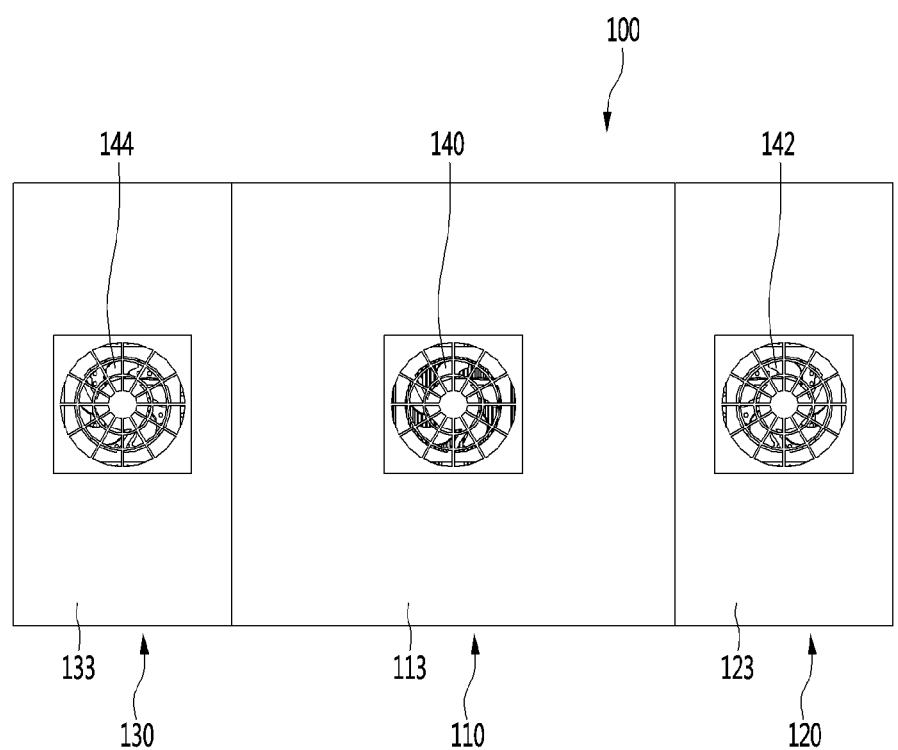
FIG. 4 is a bottom view of the foothold according to the first embodiment of the present disclosure.

FIG. 1 is a view showing a user using a foothold according to an embodiment of the present disclosure, FIG. 2 is a transparent view showing an interior of a foothold according to a first embodiment of the present disclosure, FIG. 3 is a plan view of the foothold according to the first embodiment of the present disclosure, and FIG. 4 is a bottom view of the foothold according to the first embodiment of the present disclosure.

Referring to FIG. 1, a user H may use a foothold 100 according to an embodiment of the present disclosure when sitting on a chair C and studying at a desk D.

In detail, the foothold 100 may be positioned in a space under the desk D and the user may place their feet on the top surface of the foothold 100. Further, conditioned air may be discharged and supplied to the user's feet F through the top surface of the foothold 100.

The foothold 100 may be supplied with power through an electrical wire W connected to a power supply. However, the foothold 100 is not limited thereto and may be supplied with power from a battery disposed in the foothold 100.

Referring to FIGS. 2 to 4, the foothold 100 according to an embodiment of the present disclosure may include a module housing 110 in which a dissipation fan 140 is installed, and blowing portions 120 and 130 in which blowing fans 142 and 144 are installed and that may be disposed at both sides of the module housing 110.

The blowing portions 120 and 130 may include a first blowing portion 120 disposed at a first side of the module housing 110 and a second blowing portion 130 disposed at a second side of the module housing 110. The first and second blowing portions 120 and 130 may be disposed at positions facing each other with the module housing 110 therebetween. The blowing fans 142 and 144 may include a first blowing fan 142 provided in the first blowing portion 120 and a second blowing fan 144 provided in the second blowing portion 130.

The dissipation fan 140 may be installed at a bottom surface portion 113 of the module housing 110. Further, the first blowing fan 142 may be provided at the bottom surface portion 123 of the first blowing portion 120 and the second blowing fan 144 may be provided at the bottom surface portion 133 of the second blowing fan 130.

A thermoelectric module 200 may be installed in the module housing 110 and a dissipation cover 118 through which air, which has passed through the thermoelectric module 200, is discharged may be provided at the front portion and/or the rear portion of the module housing 110.

A dissipation suction hole may be formed through the bottom surface portion 113 of the module housing 110 and the dissipation fan 140 may be disposed over the dissipation suction hole. As the dissipation fan 140 is driven, air suctioned through the dissipation suction hole may be discharged outside through the dissipation heat sink of the thermoelectric module 200. For example, the dissipation fan 140 may be an axial fan and the like.

The dissipation cover 118 for discharging air that has passed through the dissipation heat sink of the thermoelectric module 200 may be provided at the front surface portion and/or the rear surface portion of the module housing 110.

Based on a polarity of the thermoelectric element 220 (see FIG. 6) of the thermoelectric module 200, the thermoelectric module may generate cold air and dissipate hot air, or generate hot air and dissipate cold air. That is, in the present disclosure, during cooling mode, the thermoelectric element may generate cold air from the top surface and dissipate hot air from the bottom surface. During the heating mode, the thermoelectric element may generate hot air from the top surface and dissipate cold air from the bottom surface. For purposes of the present disclosure, the operation where the thermoelectric element generates cold air from the top surface and dissipates hot air from the bottom surface (i.e., cooling mode) will be described hence forth. It should be noted that the structure of the foothold remains the same whether operating in the cooling mode or heating mode.

The module housing 110 includes a cover 150. The top surface of the cover 150 may provide a surface on which user's feet F are placed. Further, the cover 150 may function as a heat absorption heat sink of the thermoelectric module 200.

Figure 5:
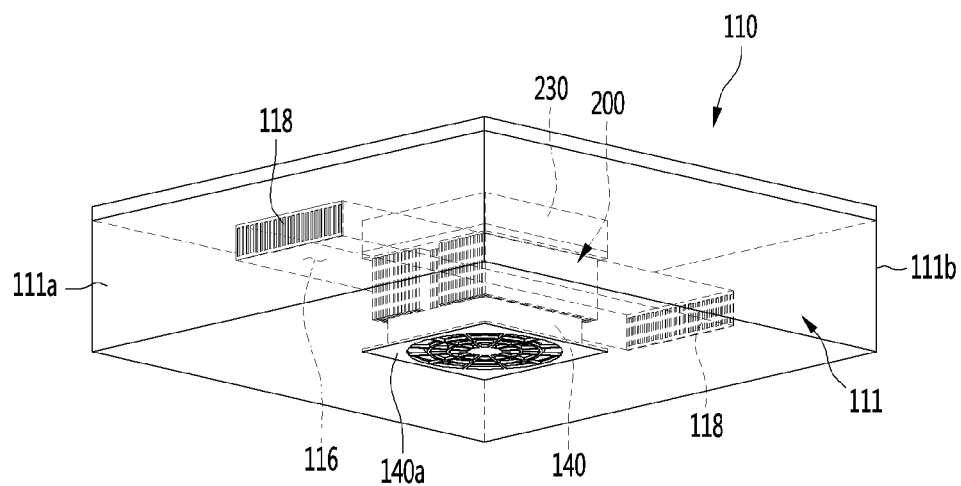
FIG. 5 is a transparent perspective view showing the configuration of a module housing according to the first embodiment of the present disclosure.

The cover 150 may be detachably coupled to a housing body 111 (see FIG. 5). A user may separate the cover 150 from the housing body 111 and then clean the cover 150, and may clean the inside of the housing body 111. Accordingly, it is possible to sanitarily manage the foothold 100.

A first blowing suction hole may be formed through the bottom surface portion 123 of the first blowing portion 120 and the first blowing fan 142 may be disposed over the first blowing suction hole. When the first blowing fan 142 is driven, air suctioned through the first blowing suction hole flows upward through the first blowing fan 142.

A first discharge portion 125 through which air is discharged may be formed at the top surface of the first blowing portion 120. The first discharge portion 125 may include a plurality of holes. The air that has passed through the first blowing fan 142 may be discharged outside through the first discharge portion 125. A first blowing channel extending toward the first discharge portion 125 from the first blowing suction hole may be formed in the first blowing portion 120.

A second blowing suction hole may be formed through the bottom surface portion 133 of the second blowing portion 130 and the second blowing fan 144 may be disposed over the second blowing suction hole. When the second blowing fan 144 is driven, air suctioned through the second blowing suction hole flows upward through the second blowing fan 144.

A second discharge portion 135 through which air is discharged may be formed at the top surface of the second blowing portion 130. The second discharge portion 135 may include a plurality of holes. The air that has passed through the second blowing fan 144 may be discharged outside through the second discharge portion 135. A second blowing channel extending toward the second discharge portion 135 from the second blowing suction hole may be formed in the second blowing portion 130. The first discharge portion 125 and the second discharge portion 135 may be referred to as a "blowing discharge portion" in combination.

Figure 6:
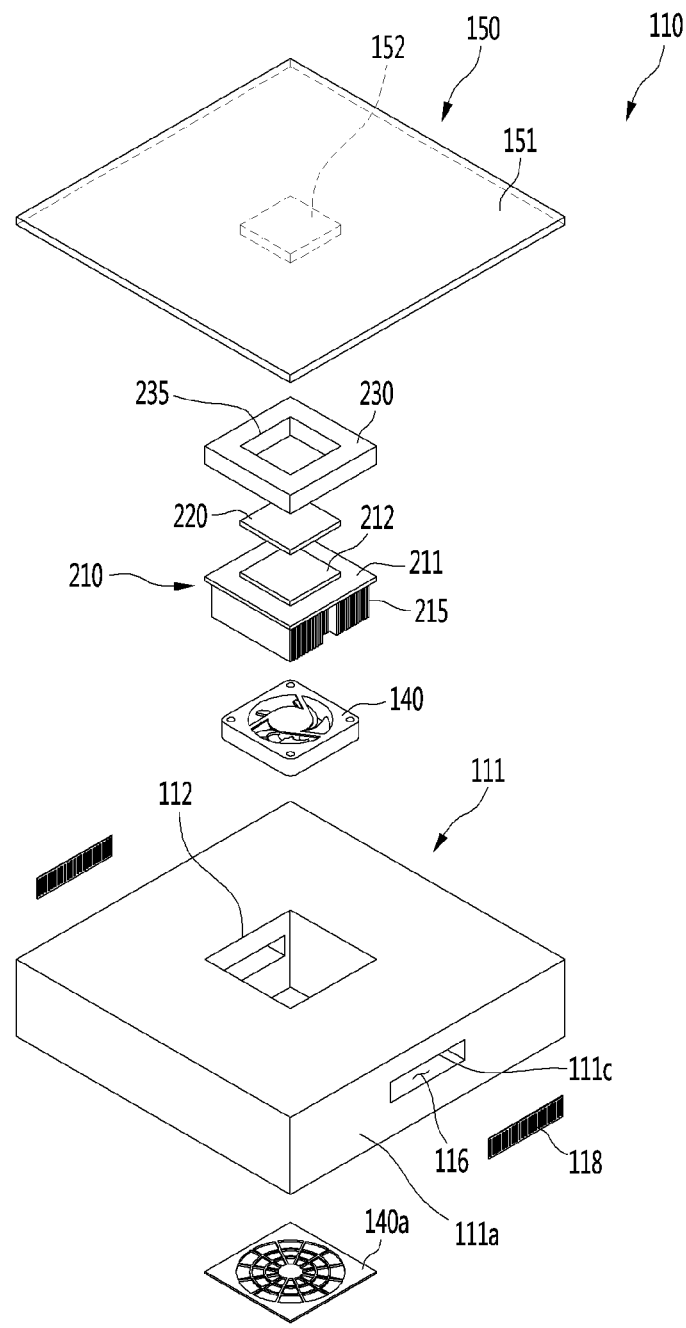
FIG. 6 is an exploded perspective view of the module housing according to the first embodiment of the present disclosure.
Figure 7:
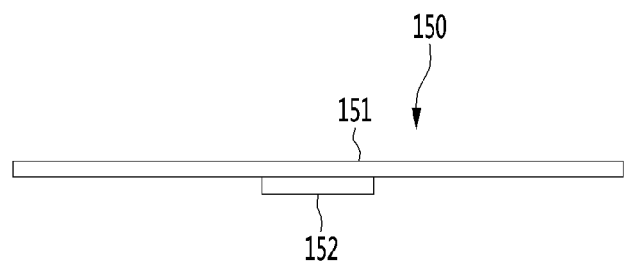
FIG. 7 is a side view of a cover according to the first embodiment of the present disclosure.

FIG. 5 is a transparent perspective view showing the configuration of a module housing according to the first embodiment of the present disclosure, FIG. 6 is an exploded perspective view of the module housing according to the first embodiment of the present disclosure, and FIG. 7 is a side view of a cover according to the first embodiment of the present disclosure.

Referring to FIGS. 5 to 7, the module housing 110 according to the first embodiment of the present disclosure may include a housing body 111, a thermoelectric module 200 installed in the housing body 111, and a heat dissipation channel 116 that is disposed in the housing body 111 and through which air, which has passed through the heat dissipation heat sink 210 of the thermoelectric module 200 after being suctioned from the housing body 111, flows.

Further, a heat dissipation cover 118 may be provided at an end of the heat dissipation channel 116.

In detail, the housing body 111 may have a hexahedral shape with at least a portion of the upper portion open. A housing opening 112 may be formed through the housing body 111. The heat dissipation fan 140 may be installed at a lower portion in the housing opening 112 and a heat dissipation cover 140a covering the lower portion of the heat dissipation fan 140 may be provided under the heat dissipation fan 140. The heat dissipation fan cover 140a may form a portion of the bottom surface of the housing body 111 and may be spaced upward apart from a floor. Further, the heat dissipation fan cover 140a may include a grill structure for preventing entry of foreign substances.

The housing body 111 may include a front surface portion 111a and a rear surface portion 111b. For example, the front surface portion 111a may be a portion to which the heels of the user's feet F are positioned close and the rear surface portion 111b may be a portion to which the toes are positioned close.

A cover opening 111c to which the heat dissipation cover 118 may be coupled may be formed at each of the front surface portion 111a and the rear surface portion 111b. The heat dissipation channel 116 may be disposed to extend from the housing opening 112 toward the front surface portion 111a and from the housing opening 112 toward the rear surface portion 111b.

When the heat dissipation fan 140 is driven, air is suctioned from under the housing body 111, flows upward in the housing opening 112, and exchanges heat with the heat dissipation heat sink 210 of the thermoelectric module 210. The air heated through heat exchange diverges to the front surface portion 111a and the rear surface portion 111b of the housing body 111, flows through the heat dissipation channel 116, and is discharged outside through the heat dissipation cover 118.

The foothold 100 may further include legs 119 disposed at the bottom surface of the housing body 111 to be placed on the floor. The legs 119 may extend from both sides of the front surface portion 111a of the housing body 111 toward the rear surface portion 111b. Further, the legs 119 may extend at an angle such that the height of the legs may be higher at the front portion than the rear portion.

By the configuration of the legs 119, the height of the rear surface portion 111b from the floor may be higher than the height of the front surface portion 111a from the floor. When the cover 150 is coupled to the top of the housing body 111 and the user's feet F are placed on the cover 150, the toes of the feet F may be positioned higher than the heels. Accordingly, when the user's feet F are placed on the foothold 100, the user may feel comfortable. Further, the bottom surface of the housing body 111 may be spaced a predetermined distance apart from the floor by the legs 119.

The thermoelectric module 200 may be installed in the housing opening 112. The foothold 100 does not include parts for operating a refrigeration cycle, for example, parts generating large noise such as a compressor, so an effect of reducing noise while the foothold 100 is operated may be obtained.

The thermoelectric module 200 may be disposed at the center portion of the housing body 111 in the front-rear direction. Further, the heat dissipation channel 116 may be disposed to extend forward and rearward from the thermoelectric module 200.

In detail, the thermoelectric module 200 may include a heat dissipation heat sink 210 being in contact with a thermoelectric element 220. The heat dissipation heat sink 210 may include a heat sink main body 211 having a substantially square or rectangular plate shape, and an element coupling portion 212 that may protrude from the top surface of the heat sink main body 211 and to which the thermoelectric element 220 may be attached or fastened.

The thermoelectric element 220 may be an element that implements cooling and heat generation using Peltier effect. A heat absorption side of the thermoelectric element may be disposed to face the upper portion of the housing body 111 and a heat dissipation side of the thermoelectric element may be disposed to face the lower portion of the housing body 111 during cooling. During heating, the heat dissipation side of the thermoelectric element may be disposed to face the upper portion of the body 111 and the heat absorption side of the thermoelectric element may be disposed to face the lower portion of the body 111.

The heat dissipation heat sink 210 may include a heat sink fin 215 that is disposed under the heat sink main body 211 and exchanges heat with air suctioned through the lower portion of the housing body 111. The heat sink fin 215 may be a plurality of pieces, such as fins, and the plurality of fins may be coupled to the bottom surface of the heat sink main body 211 and may extend downward.

The heat dissipation channel 116 may include a sink suction side channel 116a (see FIG. 10) forming an air channel from the heat dissipation fan 140 to the heat dissipation heat sink 210, and a sink discharge side channel 116b (see FIG. 10) forming an air channel from the heat dissipation heat sink 210 to the heat dissipation cover 118.

The sink suction side channel 116a and the sink discharge side channel 116b may be channels disposed in the module housing 110.

In detail, the sink suction side channel 116a may be disposed towards the heat dissipation heat sink 210 from the bottom surface of the housing body 111 and may be disposed at the center portion of the housing body 111 in the front-rear direction. The sink suction side channel 116a may form at least a portion of the housing opening 112.

The sink discharge side channel 116b may be disposed towards the front surface portion 111a and the rear surface portion 111b from the housing body 111 to the heat dissipation heat sink 210.

The thermoelectric module 200 may further include a heat absorption heat sink disposed over the module body 210. The cover 150 may be a heat absorption heat sink.

The heat absorption heat sink 150 (cover) may be disposed in contact with the heat absorption portion at the upper portion of the thermoelectric element 220 and the heat dissipation heat sink 210 may be disposed in contact with a heat dissipation portion at the lower portion of the thermoelectric element 220. The heat absorption portion and the heat dissipation portion of the thermoelectric element may have a shape that may come in surface contact, and may form opposite surfaces.

The thermoelectric element module 200 may further include a module insulator 230 disposed between the heat absorption heat sink 150 and the heat dissipation heat sink 210. For example, the module insulator 230 may be disposed to surround the edge of the thermoelectric element 220.

An insulator opening 235 may be formed through the module insulator 230. The insulator opening 235 may be formed in a hole shape through the top and bottom surfaces of the module insulator 230.

A plate protrusion 152 of the cover 150 may be inserted in the insulator opening 235 in contact with the thermoelectric element 220. The thermoelectric element 220 may be positioned in the insulator opening 235.

The plate protrusion 152 may be configured to protrude from the bottom surface of the cover 150. In detail, the cover 150 may include a cover plate 151 having a substantially square or rectangular plate shape and the plate protrusion 152 provided at the bottom surface of the cover plate 151. The top surface of the cover plate 151 may form a surface on which user's feet F are placed.

Figure 8:
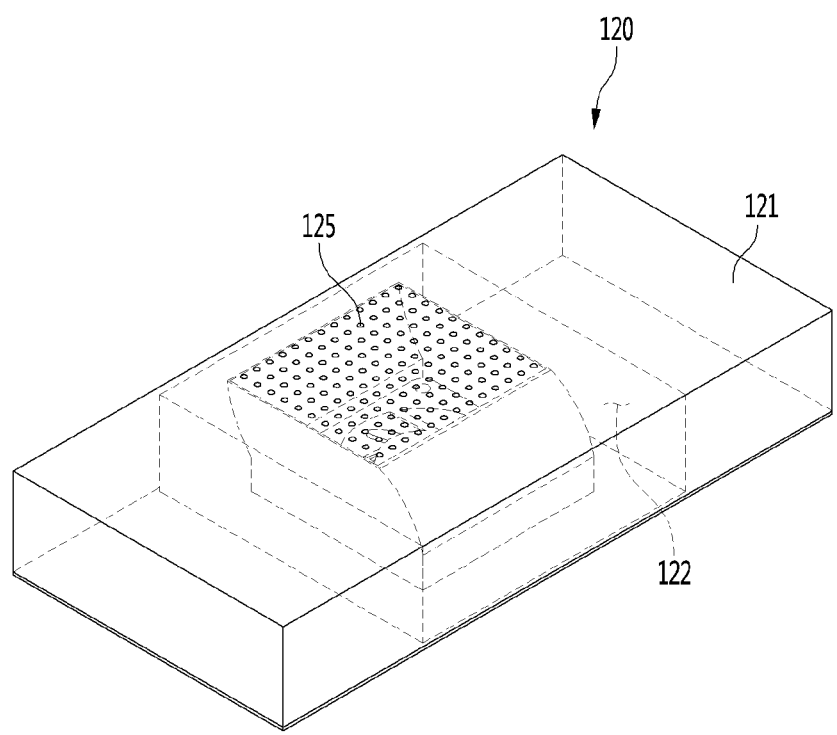
FIG. 8 is a transparent perspective view showing the configuration of a first blowing portion according to the first embodiment of the present disclosure.
Figure 9:
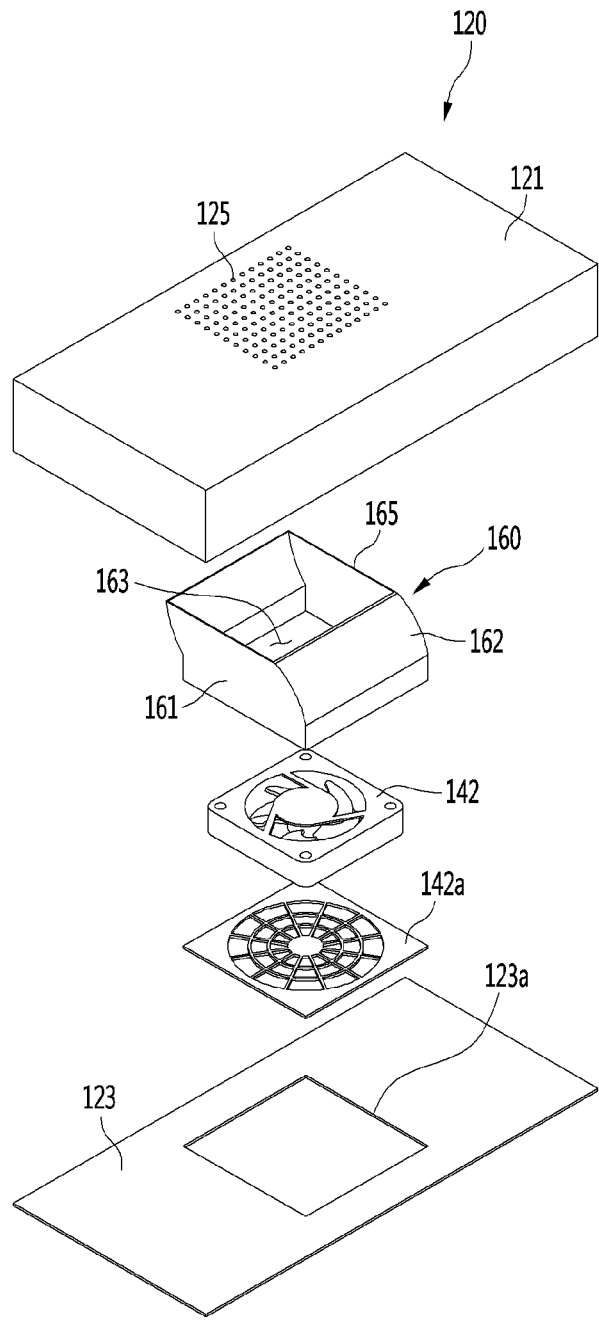
FIG. 9 is an exploded perspective view of the first blowing portion according to the first embodiment of the present disclosure.
Figure 10:
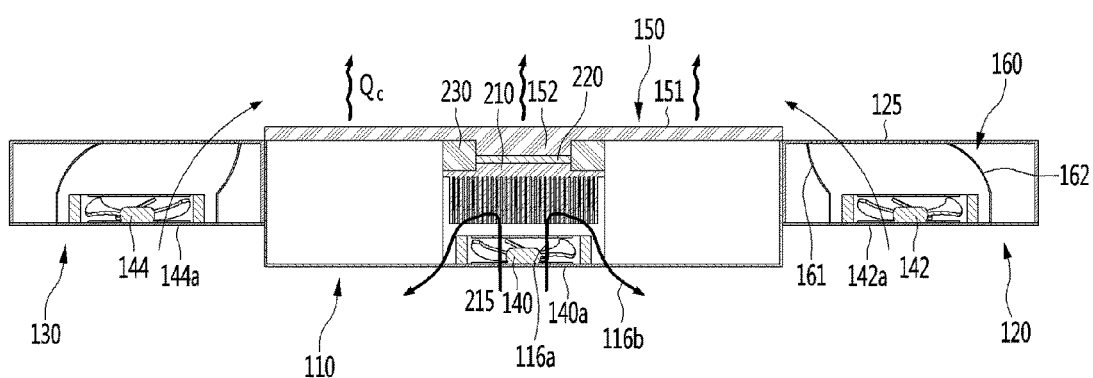
FIG. 10 is a cross-sectional view taken along line X-X' of FIG. 2.

FIG. 8 is a transparent perspective view showing the configuration of a first blowing portion according to the first embodiment of the present disclosure, FIG. 9 is an exploded perspective view of the first blowing portion according to the first embodiment of the present disclosure, and FIG. 10 is a cross-sectional view taken along line X-X' of FIG. 2.

Referring to FIGS. 8 and 9, the foothold 100 according to the first embodiment of the present disclosure may include a first blowing portion 120 and a second blowing portion 130 provided at both sides of the module housing 110. The first and second blowing portions 120 and 130 may have symmetric configurations with the module housing 110 therebetween. Further, the configurations of the first and second blowing portions 120 and 130 may be the same or similar, so the first blowing portion 120 is mainly described herein and the description of the first blowing portion 120 is equally applicable to the second blowing portion 130.

The first blowing portion 120 may include a blowing portion body 121 and a bottom surface portion 123 coupled to the lower portion of the blowing portion body 121 and having a bottom surface opening 123*a*.

The blowing portion body 121 has a square or rectangular parallelepiped shape with an open lower portion and a first discharge portion 125 through which air is discharged disposed at the top surface of the blowing portion body 121. Further, a body recession 122 in which the blowing fan 142 and the channel guide 160 may be disposed may be disposed in the blowing portion body 121. The body recession 122 may be configured to be recessed upward from the bottom surface of the blowing portion body 121.

The bottom surface portion 123 has a substantially square or rectangular plate shape and the bottom surface opening 123*a* may be disposed at the center portion of the bottom surface portion 123. The bottom surface opening 123*a* may function as a suction hole for suctioning air. A first blowing fan cover 142*a* may be coupled to the bottom surface opening 123*a* and the first blowing fan 142 may be positioned over the first blowing fan cover 142*a*. The first blowing fan 142 may be an axial fan and the like.

The first blowing portion 120 may further include a channel guide 160 installed in the blowing portion body 121. The first blowing fan 142 may be disposed in the channel guide 160 and the air that has passed through the first blowing fan 142 flows toward the first discharge portion 125 through the internal channel of the channel guide 160.

In detail, the channel guide 160 may include a guide body 161 having a fan installation space 163 and a guide discharge portion 165 disposed and opened at the upper end of the guide body 161. The guide body 161 may include a housing that is vertically hollow and the first blowing fan 142 may be positioned at the lower portion in the guide body 161.

The guide body 161 may include an inclined portion 162 for guiding air to the module housing 110. The inclined portion 162 may extend from the lower end of the guide body 161 to the guide discharge portion 165 and to have a predetermined curvature or slope.

For example, the first blowing portion 120 may be disposed at the right side of the module housing 110, and as shown in FIG. 9, the inclined portion 162 may extend from the lower end of the guide body 161 toward the center portion of the module housing 110 to be rounded or inclined towards the left going upward (see FIG. 10).

On the contrary, the second blowing portion 130 may be disposed at the left side of the module housing 110 and the inclined portion 162 of the second blowing portion 130 may extend from the lower end of the guide body 161 toward the center portion of the module housing 110 to be rounded or inclined towards the right going upward (see FIG. 10).

When the first blowing fan 142 is driven, air suctioned through the bottom surface opening 123*a* flows upward through the first blowing fan 142, turns in the channel guide 160, and may be discharged to the space over the module housing 110 through the first discharge portion 125.

Referring to FIG. 10, with the cover 150 according to the first embodiment of the present disclosure coupled to the top of the housing body 111, the plate protrusion 152 may be inserted in the insulator opening 235 of the module insulator 230. Further, the plate protrusion 152 may be in contact with the thermoelectric element 200 positioned in the insulator opening 235.

When the heat dissipation fan 140 is driven, the air suctioned into the module housing 110 exchanges heat with the heat dissipation heat sink 210 and may be discharged out of the module housing 110 through the heat dissipation channels 116*a* and 116*b*.

Meanwhile, the plate protrusion 152 may be cooled by the heat absorption portion of the thermoelectric element 200, and the cover plate 151 may be cooled by conduction through the plate protrusion 152. That is, the cover 150 may be one component of the heat absorption heat sink of the thermoelectric module 200. As a result, the top surface of the cover plate 151 being brought in direct contact with the feet of a user, is able to supply heat Qc to the user.

When the first and second blowing fans 142 and 144 are driven, the air suctioned into the first and second blowing portions 120 and 130 may be discharged to the center portion of the module housing 110 through the first and second blowing fans 142 and 144 and may be supplied to user's feet F. As a result, the user with their feet F on the top surface of the cover 150 may feel cool by contact of the feet with the cover 150 cooled by the thermoelectric module 200 and the air discharged through the first and second discharge portions 125 and 135 of the respective first and second blowing portions 120 and 130.

Figure 11:
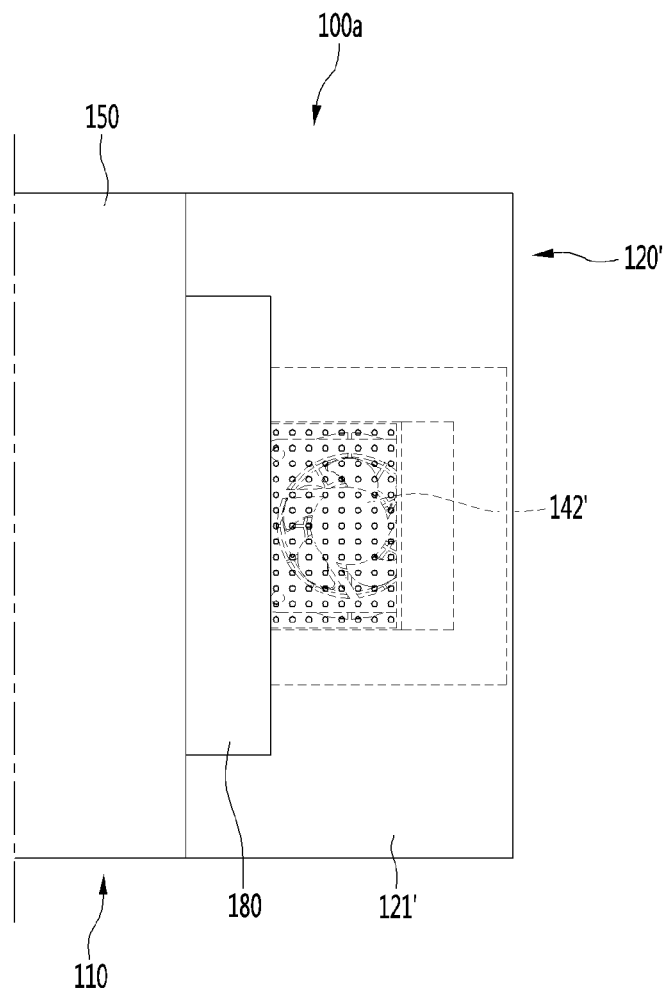
FIG. 11 is a plan view of a foothold according to a second embodiment of the present disclosure.
Figure 12:
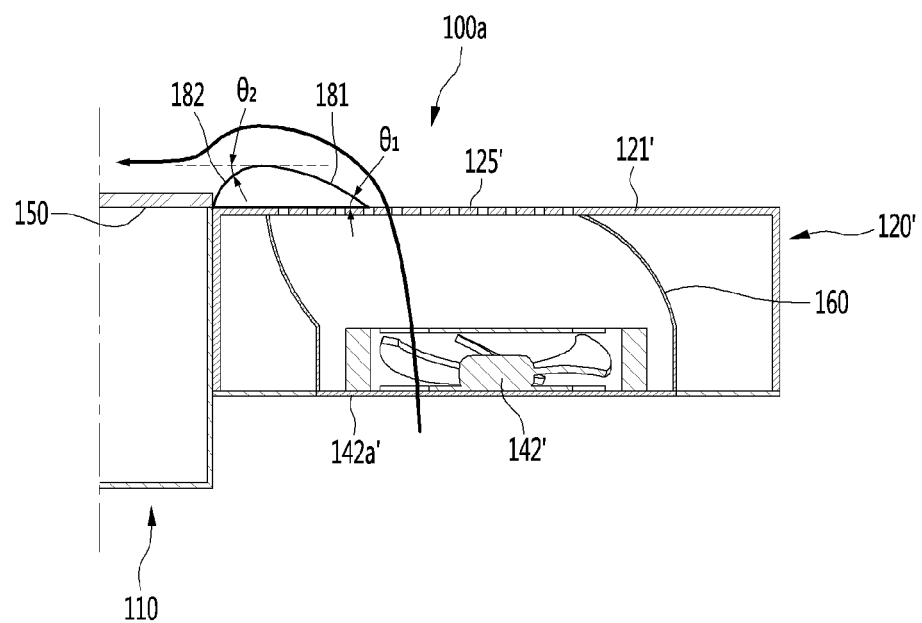
FIG. 12 is a cross-sectional view of the foothold according to the second embodiment of the present disclosure.

FIG. 11 is a plan view of the foothold according to a second embodiment of the present disclosure and FIG. 12 is a cross-sectional view of the foothold according to the second embodiment of the present disclosure.

Referring to FIGS. 11 and 12, a foothold 100*a* according to the second embodiment of the present disclosure may include a module housing 1110 and a blowing portion 120' provided at a side of the module housing 110. The description about the module housing 110 described in the first embodiment is equally applicable to the module housing 110 of the second embodiment.

The blowing portion 120' may include a blowing fan 142' and a blowing fan cover 142*a*' disposed under the blowing fan 142'. Further, the blowing portion 120' may further include a channel guide 160 that guides the flow direction of the air that has passed through the blowing fan 142' to discharge the air to the space at the module housing 110. For the description about the blowing fan 142', the blowing fan cover 142'*a*, and the channel guide 160, the description about these components in the first embodiment is equally applicable.

The blowing portion 120' may include a blowing portion body 121' having a top surface on which a first discharge portion 125' is disposed. Further, the foothold 100*a* may further include an air guide 180 disposed at the upper portion of the blowing portion 120'.

The air guide 180 may be provided to protrude from the top surface of the blowing portion body 121' and may be disposed between the first discharge portion 125' and the cover 150. Further, the air guide 180 may be formed to be rounded or inclined to have a cross-section like a wing of an airplane.

In detail, the air guide 180 may include a first surface 181 extending from the top surface of the blowing portion body 121' to incline upward at a first angle $\theta 1$ and a second surface 182 extending from the upper end of the first surface 181 to decline downward at a second angle $\theta 2$ towards the cover 150. The second angle $\theta 2$ may be greater than the first angle $\theta 1$.

When the blowing fan 142' is driven, the air discharged from the first discharge portion 125' of the blowing portion 120' flows to the cover 150 along the first and second surface 181 and 182 of the air guide 180, and in this process, reduction of flow speed may be produced while passing on the surface of the air guide (coanda effect). Accordingly, the air supply ability of the blowing portion 120' may be improved.

Figure 13:
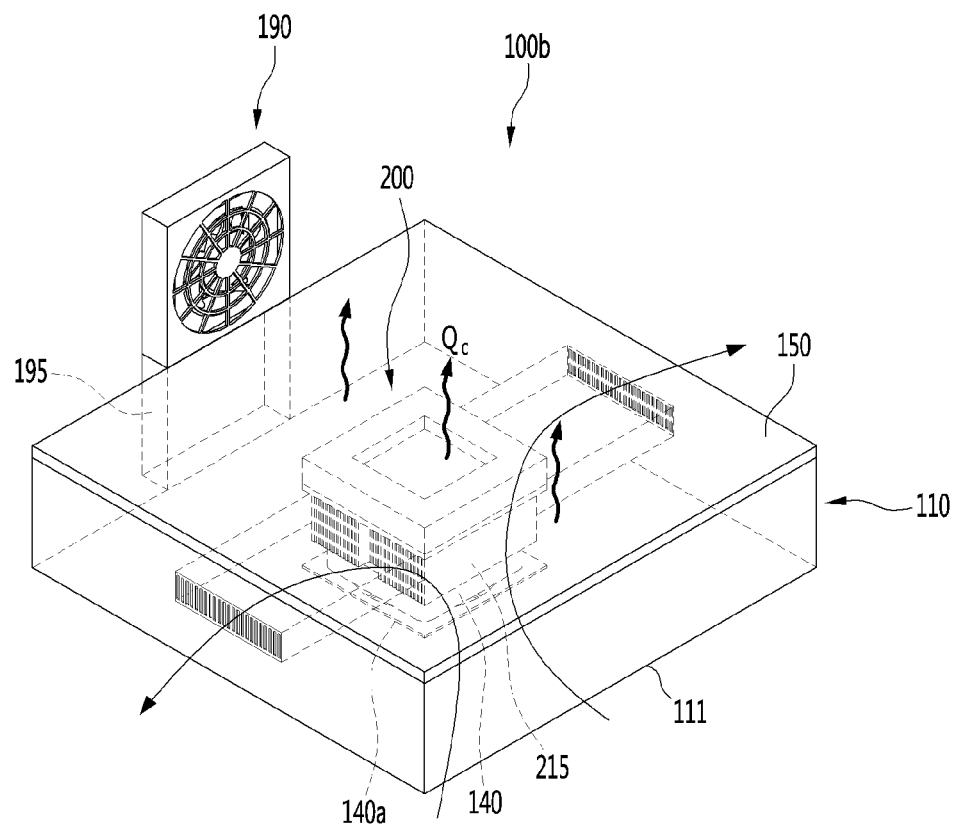
FIG. 13 is a transparent perspective view of a foothold according to a third embodiment of the present disclosure.

FIG. 13 is a transparent perspective view of a foothold according to a third embodiment of the present disclosure.

Referring to FIG. 13, a foothold 100*b* according to the third embodiment of the present disclosure includes a module housing 110. The description about the module housing 110 described in the first embodiment is equally applicable to the module housing 110 of the third embodiment.

The foothold 100*b* may further include a blowing fan 190 disposed at a side of the module housing 110. The blowing fan 190 may be an axial fan and the like. Further, a fan supporting portion 195 that supports the blowing fan 190 may be provided under the blowing fan 190.

The height of the fan supporting portion 195 may the same as or greater than the height of the module housing 110. Accordingly, the height of the center portion of the blowing fan 190 may be greater than the height of the module housing 110, particularly, the cover 150. When the blowing fan 190 is driven, the air generated from the blowing fan 190 may be supplied to the space over the cover 150.

As a result, air may be supplied over the cover 150 cooled by the thermoelectric module 200, and the user may feel cooler on their feet F.

Figure 14:
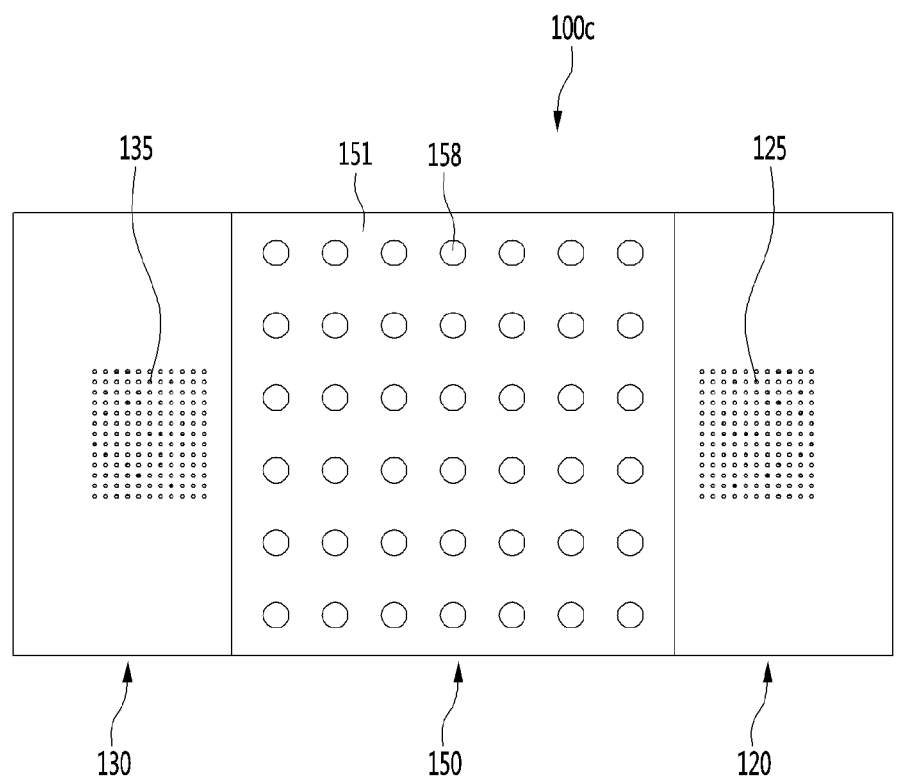
FIG. 14 is a plan view of the foothold according to a fourth embodiment of the present disclosure.

FIG. 14 is a plan view of the foothold according to a fourth embodiment of the present disclosure.

Referring to FIG. 14, a foothold 100*c* according to the fourth embodiment of the present disclosure may include a cover 150 having fins 158.

In detail, the cover 150 may include a cover plate 151 having a square or rectangular plate shape and fins 158 provided at the top surface of the cover plate 151. Further, the plate protrusion 152 described in the first embodiment may be provided on the bottom surface of the cover plate 151.

The fins 158 may be configured to have a semispherical shape. The heat exchange area of the cover 150 may be increased by the fins 158, and the heat transfer efficiency may be improved. Further, since user's feet F are placed on the top surface of the cover 150, it may be possible to additionally obtain an acupressure effect.

What is claimed is:

1. A foothold comprising:
a module housing including a dissipation fan;
a dissipation heat sink provided over the dissipation fan;
a cover disposed on the module housing and having a top surface on which user's feet are placed;
a thermoelectric element disposed between the dissipation heat sink and the cover; and
a blowing portion disposed at a side of the module housing and including a blowing fan to blow air to a space over the cover.

2. The foothold of claim 1, wherein the module housing includes:
a housing body having a housing opening through the housing body in an up-down direction; and
the cover disposed on the housing body.

3. The foothold of claim 2, wherein the dissipation fan is disposed at a lower portion of the housing opening, and
the dissipation heat sink is disposed over the dissipation fan.

4. The foothold of claim 2, further comprising:
a dissipation channel disposed in the housing body, and a cover opening provided at an end of the dissipation channel and disposed at at least one surface of the housing body; and
a dissipation cover disposed at the cover opening.

5. The foothold of claim 4, wherein the housing opening includes a dissipation hole, and
the dissipation channel defining a channel from the heat dissipation hole to the cover opening.

6. The foothold of claim 5, wherein the dissipation channel includes:
a sink suction side channel forming an air channel from the dissipation fan to the dissipation heat sink; and
a sink discharge side channel extending from the dissipation heat sink to the dissipation cover.

7. The foothold of claim 2, wherein the cover includes:
a cover plate disposed at the housing body; and
a plate protrusion protruding downward from a bottom surface of the cover plate, the plate protrusion being in communication with a heat absorption/dissipation portion of the thermoelectric element.

8. The foothold of claim 7, further comprising a module insulator surrounding the thermoelectric element and having an insulator opening,
wherein the plate protrusion is inserted into the insulator opening.

9. The foothold of claim 1, wherein the blowing portion further includes a channel guide including an installation space in which the blowing fan is installed, channel guide including a guide discharge portion at an upper end thereof, and
wherein the channel guide includes an inclined portion configured to be rounded or inclined toward the module housing.

10. The foothold of claim 1, wherein the blowing portion includes:
a first blowing portion disposed at a first side of the module housing; and
a second blowing portion disposed at a second side of the module housing.

11. The foothold of claim 1, wherein the blowing portion further includes:
a blowing discharge portion disposed at a top surface of the blowing portion to discharge air; and
an air guide to guide the air, which has passed through the blowing fan, over the cover, and
the air guide is disposed between the blowing discharge portion and the cover.

12. The foothold of claim 11, wherein the air guide includes:
a first surface extending from the top surface of the blowing portion and inclined upward at a first angle; and
a second surface extending from an upper end of the first surface and inclined downward at a second angle toward the cover, and
the second angle is greater than the first angle.

13. The foothold of claim 1, wherein the blowing portion further includes a fan support portion to support the blowing fan, and
a height of a center portion of the blowing fan is greater than a height of the cover.

14. The foothold of claim 2, wherein the cover includes:
a cover plate disposed at the housing body; and
at least one fin protruding upward from a top surface of the cover plate.

15. The foothold of claim 1, wherein the dissipation fan is disposed at a bottom portion of the module housing, and
the blowing fan is disposed at a bottom portion of the blowing portion.

16. A foothold comprising:
a module housing including a housing body in which a dissipation fan is provided and a cover provided on the housing body and having a top surface on which user's feet are placed;
a dissipation heat sink provided over the heat dissipation fan;
a thermoelectric element disposed between the dissipation heat sink and the cover; and
a blowing portion disposed at least at a side of the module housing and including a blowing fan to supply air to a space over the cover.

17. The foothold of claim 16, wherein a channel disposed in the housing body includes:
a sink suction side channel forming a first air channel from the dissipation fan to the dissipation heat sink; and
a sink discharge side channel forming a second air channel from the dissipation heat sink to the dissipation cover.

18. The foothold of claim 16, wherein the blowing portion includes a plurality of blowing portions, and
wherein the module housing is provided between the plurality of blowing portions.

19. The foothold of claim 16, wherein a dissipation suction hole for suctioning air is disposed at a bottom portion of the module housing, and
the dissipation fan is disposed over the dissipation suction hole so that the dissipation fan suctions air through the dissipation suction hole and guides the air to the thermoelectric element.

20. The foothold of claim 16, wherein at least one of the dissipation fan and the blowing fan includes a axial fan.

* * * * *